United States Patent [19]
McPartland

[11] Patent Number: 5,889,704
[45] Date of Patent: Mar. 30, 1999

[54] LOAD AND LEAVE MEMORY CELL

[75] Inventor: Richard Joseph McPartland, Nazareth, Pa.

[73] Assignee: Lucent Technologies Inc., Murray Hill, N.J.

[21] Appl. No.: 805,820

[22] Filed: Feb. 26, 1997

[51] Int. Cl.$^6$ .................................................. G11C 16/00
[52] U.S. Cl. ................ 365/185.08; 365/150; 365/185.23
[58] Field of Search ...................... 365/185.08, 185.28, 365/149, 150, 185.05, 185.23; 257/298

[56] References Cited

U.S. PATENT DOCUMENTS

| | | | |
|---|---|---|---|
| 4,037,242 | 7/1977 | Gosney | 365/185.08 |
| 4,486,769 | 12/1984 | Simko | 365/185.28 |
| 4,601,020 | 7/1986 | Arakawa et al. | 365/185.28 |
| 4,903,236 | 2/1990 | Nakayama et al. | 365/185.28 |
| 5,557,569 | 9/1996 | Smayling et al. | 365/185.28 |
| 5,615,147 | 3/1997 | Chang et al. | 365/185.28 |
| 5,633,518 | 5/1997 | Broze | 365/185.28 |

*Primary Examiner*—Tan T. Nguyen

[57] ABSTRACT

A semiconductor EEPROM memory cell having a control circuit and an internal memory device for providing high speed electronic data storage (i.e. writing binary 1 and 0 functionality) in a relatively small physical area. In general, internal memory device has a floating gate, and a source, a drain and a gate coupled to the control circuit. In operation, the control circuit provides electrical signals to the source, drain and gate to control the writing of electrical data to and reading of electrical data from the internal memory device. When writing data to the memory device the control circuit provides electrical signals to the source, drain and gate to initiate electron tunneling between the floating gate and drain, wherein the electron tunneling ultimately produces a conductive or nonconductive state representing the data stored by the internal memory device. Similarly, when reading data from the internal memory device, the control circuit couples the drain, source and gate to a given electrical signal to detect the conductive or nonconductive state (i.e. the data) stored by the internal memory device.

43 Claims, 2 Drawing Sheets

LOAD AND LEAVE MEMORY CELL

FIELD OF THE INVENTION

This invention relates to electronic data storage in semiconductor memory devices, and more particularly to a new memory cell architecture.

BACKGROUND OF THE INVENTION

Presently, there are several types of semiconductor memory devices used for storing electronic data. They include Electronically Erasable Programmable Read Only Memory (EEPROM), Static Random Access Memory (SRAM) and Dynamic Random Access Memory (DRAM). Each memory type is composed of a plurality of memory cells, wherein each type of cell is uniquely designed to store electronic data (e.g. binary data) for retrieval at some later time.

Since each type of cell (i.e. DRAM cells, SRAM cells and EEPROM cells) has a different physical design from the other, one memory type may be more desirable for certain application than others. For example, an EEPROM is composed of a plurality of cells (EEPROM cells) which are relatively small in size. As a result, less silicon area is needed to manufacture an EEPROM memory than is required to manufacture SRAM having the same memory storage capacity. Thus, EEPROM memory can be less costly than SRAM having the same storage capacity. EEPROM memory can also have more storage capacity than SRAM due to its smaller size. Thus, an EEPROM is useful to provide electronic data storage in application wherein space and cost are at a premium. Such applications include watches, pagers and cellular phones.

Storing data in an EEPROM cell, however, is substantially slower than most other types of memory. That is, it takes more time to store data in an EEPROM memory cell than it takes for SRAM and DRAM memory cells. As a result, an EEPROM is not desirable for most memory applications where stored data must be quickly and frequently changed. Such applications include the operation of word processing software on a personal computer.

The types of memory that provide a faster write time than EEPROM include SRAM and DRAM devices. As described above, the increased speed of these devices is a function of their cell architecture. For example, a DRAM cell has a special capacitor for storing a charge, wherein the capacitor is used to control the data state of the DRAM cell. As a result, the capacitor is instrumental in providing a quick means of writing data within the cell. Also, when reading the content of a DRAM cell, the charge stored on the special capacitor must be large enough to be detectable by the device utilizing the memory. With the inclusion of such a capacitor, however, DRAM memories require a complicated and costly manufacturing process, and thus are not desirable for all high speed applications.

SRAM devices, although fast, are also not desirable for all high speed applications because an SRAM is composed of cells (SRAM cells) that are larger than both EEPROM cells and DRAM cells. Thus, for those applications where space or cost is at a premium, SRAM memories are less desirable than both EEPROM and DRAM devices.

Moreover, neither EEPROM, DRAM, nor SRAM are well suited for some of the many embedded applications for which electronic memory storage is required today. For example, for those applications requiring embedded memory in microcontrollers or logic chips, both speed and space are at a premium. As a result, many embedded applications require a memory that is fast, compact and inexpensive to make. As described above, neither DRAM, SRAM nor EEPROM devices provide both space and speed features for all such applications. As a result, there is a need for a memory device that is smaller than SRAM, less costly to produce than DRAM and faster to write to than EEPROM.

SUMMARY OF THE INVENTION

The present invention provides a memory that is comprised of a plurality of memory cells, wherein each cell has a control circuit and an internal memory device that provide high speed electronic data storage (i.e. writing 1 and 0 data functionality) in a relatively small physical area.

In general, the internal memory device has a floating gate, and a source, a drain and a gate coupled to the control circuit. In operation, the control circuit provides electrical signals to the source, drain and gate to control the writing of electrical data to and reading of electrical data from the internal memory device. When writing data to the memory device the control circuit provides electrical signals to the source, drain and gate to cause electron tunneling between the floating gate and drain, wherein the electron tunneling ultimately produces a conductive or non-conductive state representing the stored data (0 or 1 respectively) at the internal memory device. Similarly, when reading data from the internal memory device, the control circuit couples the drain, source and gate to a given electrical signal to detect which state, conducting or non-conducting (i.e. what data), is stored therein.

In one illustrative embodiment, the internal memory device is a floating gate EEPROM device and the control circuit has four transistors and two capacitors electrically coupled between a drain signal line, a gate signal line, a source signal line, two memory address lines and the floating gate EEPROM. In such an embodiment, the control circuit utilizes the signal lines and the memory address lines to couple electrical signals to the drain, source and gate of the floating gate EEPROM to control the flow of electrical data to and from the memory device. For example, writing the floating gate EEPROM to a conductive state (0), the control circuit couples the floating gate low towards ground, and couples the drain towards a high voltage (e.g., about 7 volts). When placed in this state, electrons will tunnel off the floating gate to the drain, making the floating gate more positively charged, thus making the EEPROM cell enter the conductive state (0). Similarly, when writing the floating gate EEPROM to a given non-conductive state (1), the control circuit couples the floating gate towards a high voltage, and couples the drain to ground potential. When placed in this state, electrons will tunnel from the drain to the floating gate, thus making the floating gate EEPROM enter the nonconductive state (1). Because tunneling between the source and floating gate is not desired, the source is kept at some potential between ground and the high voltage, typically one half (½) of the high voltage value (e.g., about 3.5 V). The high voltage value is determined based on the programming voltage differential between the floating gate and drain which is required to effect adequate tunneling.

When reading electrical data stored in a cell of the above illustrative embodiment, the control circuit couples the source, drain and gate to given potentials such that if the cell had been previously programmed to a "0", the cell will conduct and the drain will be moved toward the source potential, whereas if the cell had been previously programmed to a "1", the drain will remain at some precharge voltage.

In any embodiment, however, the control circuit does not actively hold the gate and drain at the given potentials until the electron tunneling causes the internal memory to reach the desired conductive or nonconductive state (e.g. "0" or "1"). Rather, the control circuit disconnects the drain and gate from their voltage sources while the cell is still in the process of being written by tunneling, as described above. Gate and drain potentials necessary for tunneling are held by the two capacitors within the control circuitry. This allows other cells in the memory device to be written to or read from without having to wait for each cell to reach its desired state. As a result, the cells can be written faster than EEPROM cells, but without the costs associated with DRAM and SRAM cells, as described above. Thus, the present invention overcomes to a large extent the limitations of the prior art. These and other features of the invention are described in more detail in the following detailed description of the embodiments of the invention when taken with the drawings. The scope of the invention, however, is limited only by the claims appended hereto.

DETAILED DESCRIPTION OF ILLUSTRATIVE EMBODIMENTS OF THE INVENTION

Figure 1:
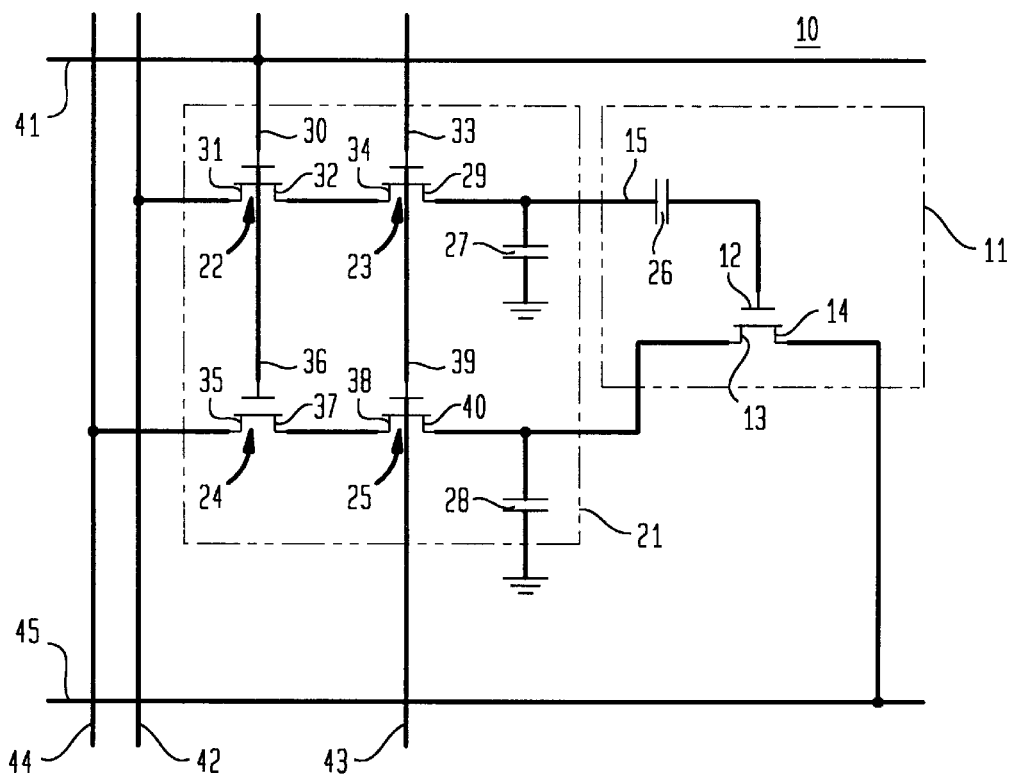
FIG. 1 is an electrical schematic of one illustrative embodiment of a memory cell according to the present invention.

Referring now to FIG. 1, there is shown an electrical schematic of one illustrative embodiment of a memory cell according to the present invention, hereinafter referred to as memory cell 10. As shown, memory cell 10 has an internal memory device 11 electrically coupled to a control circuit 21. Internal memory device 11 has a floating gate 12, a drain 13, a source 14, a gate 15, and a first capacitor 26. As depicted in FIG. 1, floating gate 12 is disposed between the gate 15 and the drain 13. Control circuit 21 has a first transistor 22, a second transistor 23, a third transistor 24, a fourth transistor 25, and a second and third capacitor 27 and 28 respectively.

First capacitor 26 is electrically coupled between a source 29 of second transistor 23 and floating gate 12 within the internal memory device 11. Second capacitor 27 is electrically coupled between source 29 of second transistor 23 and ground. Third capacitor 28 is electrically coupled between drain 13 of internal memory device 11 and ground.

First transistor 22 has a gate 30 coupled to a first memory address line 41, a drain 31 coupled to a gate signal line 42, and a source 32 coupled to a drain 34 of second transistor 23. Second transistor 23 further has a gate 33 coupled to a second memory address line 43, and source 29. Source 29 is coupled to gate 15 of internal memory device 11. Third transistor 24 has a drain 35 coupled to a drain signal line 44, a gate 36 coupled to first memory address line 41, and a source 37 coupled to a drain 38 of fourth transistor 25. Fourth transistor 25 further has a gate 39 coupled to second memory address line 43, and a source 40 coupled to drain 13 of internal memory device 11. Source 14 of internal memory device 11 is coupled to a source signal line 45.

In operation, when first and second memory address lines 41 and 43 are brought to a high state, first, second, third and fourth transistors 22, 23, 24, and 25 respectively will conduct and couple gate signal line 42 through first and second capacitors 26 and 27 to floating gate 12 of internal memory device 11, and couple drain signal line 44 through third capacitor 28 to drain 13 of internal memory device 11. Control circuit 21, however, directly routes source signal line 45 to source 14 of internal memory control device 11 independent of first and second memory address lines 41 and 43. As a result, when writing data to internal memory device 11, first and second address lines 41 and 43 are brought to a high state, and drain signal line 44 and gate signal line 42 are brought to an electrical potential that initiates electron tunneling between floating gate 12 and drain 13 of internal memory device 11. Thus, the actual electrical potential of drain and gate signal lines 44 and 42 respectively, directly depends on the data written to the internal memory device 11.

In one illustrative embodiment, to write a binary 1 to memory cell 10, control circuit 21 couples a high voltage to gate 15 (thereby coupling a high voltage to floating gate 12) and a ground potential to drain 13. This automatically initiates electron tunneling from drain 13 to floating gate 12, thus creating a nonconductive state (binary 1) thereon. Similarly, to write a binary 0 to memory cell 10, control circuit 21 couples a high voltage to drain 13 and ground to gate 15 (thereby coupling a low voltage to floating gate 12). This automatically initiates electron tunneling from floating gate 12 to drain 13, thus creating a conductive state (binary 0) thereon.

When writing such data to internal memory device 11, second and third capacitors 27 and 28 quickly charge to the electrical potential routed to floating gate 12 and drain 13, respectively. When charged, capacitors 27 and 28 help maintain the electrical potential on internal memory device 11 such that the electron tunneling continues until the desired conductive or nonconductive state is reached, which typically takes approximately 100 milliseconds. As a result drain signal line 44 and gate signal line 42 can be decoupled from internal memory device 11 at a predetermined time before the electron tunneling is complete, without interrupting the data being written to the internal memory device 11. Thus, control circuit 21 enables other such cells in a memory to be addressed and written to much earlier. This substantially reduces the apparent time necessary to write a memory comprised of such cells over a memory having cells without a control circuit such as control circuit 21. Specifically, the actual write time observed external to the memory cell 10 appears to be approximately 10 nanoseconds. Moreover, by using an EEPROM device as internal memory device 11, memory cell 10 can provide the quick write feature through a memory device substantially smaller than SRAM and DRAM cells. Thus, the present invention overcomes to a large extent the limitation of the prior art.

Figure 2:
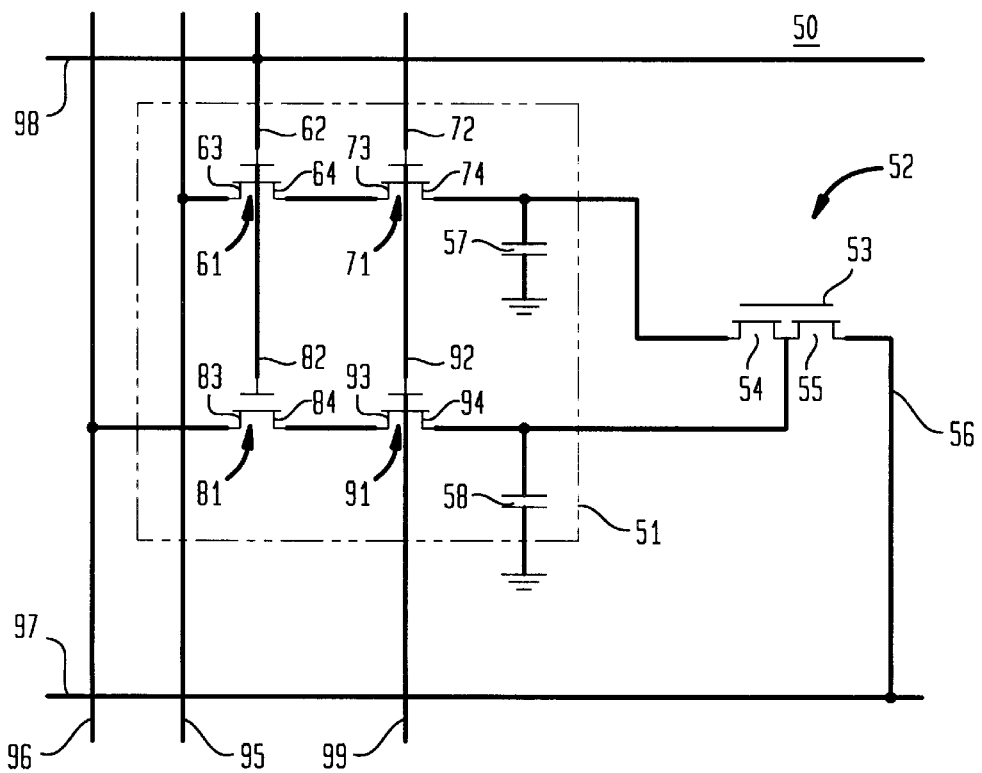
FIG. 2 is a physical schematic of a cell in one illustrative embodiment of a memory according to the present invention.

Another illustrative embodiment of the memory cell of the present invention is shown in FIG. 2, hereinafter referred to as memory cell 50. As shown, memory cell 50 has a control circuit 51 electrically coupled to an internal memory device or floating gate EEPROM device 52. Floating gate EEPROM device 52 has a floating gate 53, a gate 54, a drain 55 and a source 56. The physical structure of gate 54 is part of a metal-oxide-silicon (MOS) capacitor. Gate 54 is the silicon side of this capacitor, whereas the floating gate 53 is the metal, usually polysilicon, side of the capacitor. Control circuit 51 has a first transistor 61, a second transistor 71, a third transistor 81 and a fourth transistor 91, a first capacitor 57, and a second capacitor 58.

First transistor 61 has a gate 62 coupled to a first memory address line 98, a drain 63 coupled to a gate signal line 95, and a source 64. Second transistor 71 has a gate 72 coupled to a second memory address line 99, a drain 73 coupled to source 64 of first transistor 61, and a source 74 coupled to gate 54 of floating gate EEPROM 52. Third transistor 81 has a gate 82 coupled to first memory address line 98, a drain 83 coupled to a drain signal line 96, and a source 84. Fourth transistor 91 has a gate 92 coupled to second memory address line 99, a drain 93 coupled to source 84 of third transistor 81, and a source 94 coupled to drain 55 of floating gate EEPROM device 52. First capacitor 57 is electrically coupled between gate 54 of floating gate EEPROM device 52 and ground. Second capacitor 58 is electrically coupled between drain 55 of floating gate EEPROM device 52 and ground. Control circuit 51 couples source 56 of floating gate EEPROM device 52 to source signal line 97.

In operation, memory cell 50 provides memory storage (i.e. write and read functions) in a similar manner as that described for the operation of memory cell 10 shown in FIG. 1. That is, when first and second memory address lines 98 and 99 are brought to a high state, control circuit 51 will couple gate signal line 95 to gate 54 of floating gate EEPROM device 52, and couple drain signal line 96 to drain 55 of floating gate EEPROM device 52. Control circuit 51, however, directly routes source signal line 97 to source 56 of floating gate EEPROM device 52 independent of first and second memory address lines 98 and 99. Thus, when writing data to floating gate EEPROM device 52, control circuit 51 initiates electron tunneling between floating gate 53 and drain 55 in a direction depending on what data (i.e. binary 0 or 1) is being written to floating gate EEPROM device 52. Thus, the actual electrical potential of the signal coupled to gate 54 and drain 55 directly depends on the data written to the floating gate EEPROM device 52.

In one illustrative embodiment, control circuit 51 writes a binary 1 to floating gate EEPROM device 52 by coupling a high voltage to gate 54 and a ground potential to drain 55. This automatically initiates electron tunneling from drain 55 to floating gate 53, thus creating a non-conductive state (binary 1) thereon. Similarly, to write a binary 0, control circuit 51 couples a high voltage to drain 55 and ground to gate 54. This automatically initiates electron tunneling from floating gate 53 to drain 55, thus creating a conductive state (binary 0) thereon.

As with memory cell 10 shown in FIG. 1 and described above, after initiating electron tunneling to achieve the desired conductive state at floating gate EEPROM device 52 (i.e. binary 0 or 1), electron tunneling is maintained independent of the electrical potential coupled from drain signal line 96 and gate signal line 95 to floating gate EEPROM device 52. As a result, control circuit 51 can decouple drain signal line 96 and gate signal line 95 from floating gate EEPROM device 52 before the electron tunneling is complete, without interrupting the data written to floating gate EEPROM device 52. Consequently, control circuit 51 enables other cells in a memory made of such cells to be addressed without having to wait for the completion of electron tunneling of the present cell. This essentially reduces the apparent write time of each cell, thus increasing the overall performance of a memory composed of a plurality of such cells. Moreover, by using floating gate EEPROM device 52 as the storage element in the memory cell 50, data can be stored in a much smaller area than a memory composed of SRAM and DRAM cells.

Figure 3:
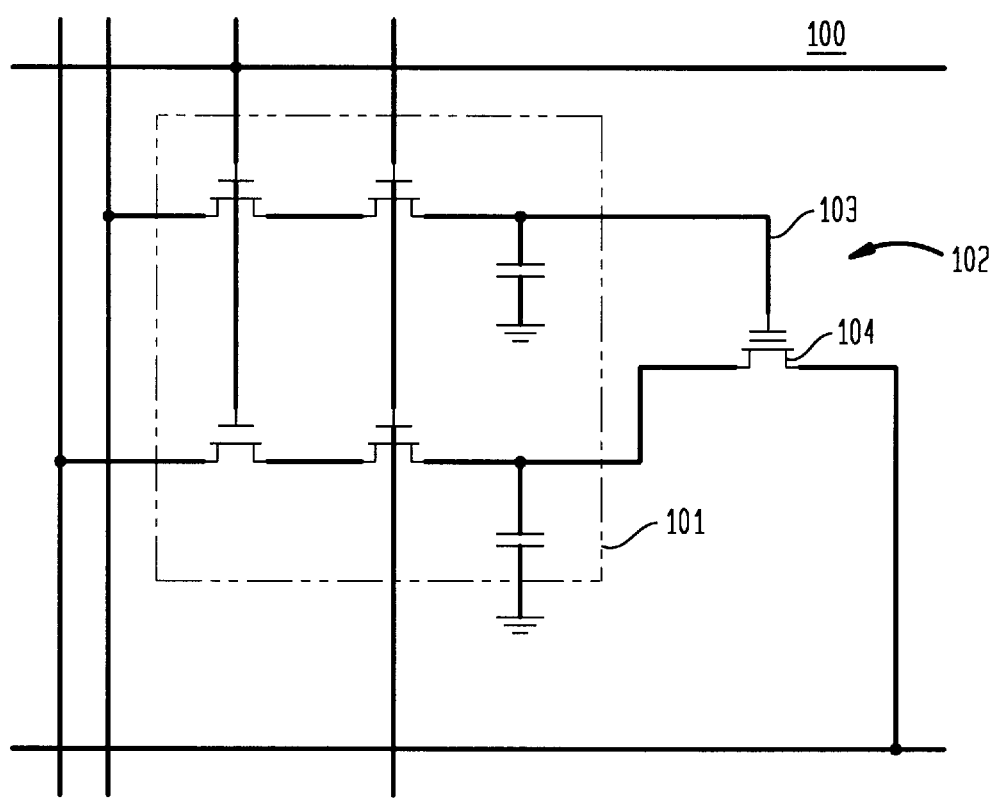
FIG. 3 is a physical schematic of a cell in another illustrative embodiment of a memory device according to the present invention.

Yet another illustrative embodiment of the present invention is shown in FIG. 3, hereinafter referred to as memory cell 100. As shown, memory cell 100 has a control circuit 101 coupled to floating gate EEPROM device 102. As described above, in operation control circuit 101 couples predetermined electrical potential to floating gate EEPROM device 102 to initiate electron tunneling when writing data to memory cell 100. The difference between memory cell 100 and memory cells 10 and 50 described above is the physical structure of floating gate EEPROM device 102. Floating gate EEPROM device 102 is commonly known in the art as a stacked gate EEPROM device, having floating gate 104 and gate 103. The physical difference, however, does not alter the basic operation of the memory cell as described above.

It will be apparent to one skilled in the art that the memory cells shown in these exemplary embodiments can also be included as part of a larger circuit application. For example, a memory storage device can be designed to include at least one of these memory cells according to the principles of the invention. Moreover, an integrated circuit can be manufactured using techniques known to those skilled in the art, wherein the integrated circuit includes at least one of the memory cells in accordance with the principles of the invention.

Although the present invention is described in terms of specific illustrative embodiments of a memory cell providing high speed write and erase functionality in a relatively small memory device (e.g. a floating gate EEPROM device), the present invention is not hereby limited to the embodiments shown. Rather, these embodiments are only illustrative of the many different memory cell structures that can be used to store memory according to the present invention. Consequently, references to specific examples and embodiments in the description should not be construed to limit the present invention in any manner, and are merely provided for the purpose of describing the general principles of the present invention. It will be apparent to one of ordinary skill in the art that numerous modifications may be made to the present invention, and all such modifications are intended to be included within the scope of the invention as defined in the appended claims.

What is claimed is:

1. A memory cell for storing electrical data, comprising:
   a memory device having a gate, a floating gate, a source and a drain, wherein said floating gate is disposed between said gate and said drain;
   a control circuit coupled to said memory device for writing the electrical data to and reading the electrical data from said memory device, said control circuit being operable to generate electron tunneling between said floating gate and said drain when writing the electrical data to said memory device; and
   a storage medium disposed between said control circuit and said memory device operable to cause said electron tunneling to be maintained until a state change occurs for said memory device.

2. The memory cell of claim 1 wherein said memory device is an electronically erasable programmable read only memory (EEPROM).

3. The memory cell of claim 2 wherein the electrical data is binary data.

4. The memory cell of claim 2 wherein said EEPROM device is a floating gate EEPROM device.

5. The memory cell of claim 2 wherein said EEPROM device is a stacked gate EEPROM device.

6. The memory cell of claim 1 wherein said control circuit and said storage medium cooperate to write a binary state 0 to said memory device when in a conductive state, and to write a binary state 1 to said memory device when in a nonconductive state.

7. The memory cell of claim 6 wherein said control circuit and said storage medium are operable to generate and maintain electron tunneling from said floating gate to said drain when writing in said conductive state to said memory device.

8. The memory cell of claim 6 wherein said control circuit and said storage medium are operable to generate and maintain electron tunneling from said drain to said floating gate when writing in said nonconductive state to said memory device.

9. The memory cell of claim 6 wherein said control circuit and said storage medium are operable to couple said gate to ground potential and said drain to a high potential when writing to said memory device in said conductive state.

10. The memory cell of claim 9 wherein said high potential is about 7 volts.

11. The memory cell of claim 6 wherein said control circuit and said storage medium are operable to couple said floating gate to a high potential and said drain to ground potential when writing to said memory device in said nonconductive state.

12. The memory cell of claim 11 wherein said high potential is about 7 volts.

13. The memory cell of claim 1 wherein said control circuit and said storage medium cooperate to electrically couple said memory device to a voltage source to initiate and maintain said electron tunneling between said floating gate and said drain when writing the electrical data to said memory device.

14. The memory cell of claim 13 wherein said electron tunneling takes approximately 100 milliseconds to establish a binary 0 when said control circuit operates in said conductive state, and wherein said electron tunneling takes approximately 100 milliseconds to establish a binary 1 when said control circuit operates in said nonconductive state.

15. The memory cell of claim 13 wherein said control circuit is operable to decouple said memory device from said voltage source at a predetermined time after initiating said electron tunneling said storage medium thereafter operating to substantially maintain said electron tunneling between said floating gate and said drain when writing the electrical data to said memory device.

16. The memory cell of claim 15 wherein said predetermined time for decoupling said memory device from said voltage source after initiating said electron tunneling is approximately 10 nanoseconds.

17. The memory cell of claim 1 wherein said control circuit and said storage medium collectively comprise:
a first transistor having a gate, a source and a drain;
a second transistor having a drain coupled to said source of said first transistor, a source coupled via coupling means to said memory device gate, said coupling means including a first capacitor, and a gate;
a second capacitor coupled between said second transistor source and ground;
a third capacitor coupled between said memory device drain and ground;
a third transistor having a gate coupled to said gate of said first transistor, a source, and a drain;
a fourth transistor having a source coupled to said memory device drain and said third capacitor, a gate coupled to said gate of said second transistor, and a drain coupled to said source of said third transistor;
a source signal line coupled to said memory device source to supply a given electrical signal thereto;
a gate signal line coupled to said drain of said first transistor to supply a given electrical signal thereto;
a drain signal line coupled to said drain of said third transistor to supply a given electrical signal thereto;
a first memory address signal line coupled to said gates of said first and said third transistors for supplying an electrical signal thereto; and
a second memory address signal line coupled to said gates of said second and said fourth transistors to supply an electrical signal thereto.

18. An integrated circuit for storing electrical data, comprising:
at least one memory cell, said at least one memory cell comprising a memory device having a gate, a floating gate, a source and a drain, wherein said floating gate is disposed between said gate and said drain;
a control circuit coupled to said memory device for writing the electrical data to and reading the electrical data from said memory device, said control circuit being operable to generate electron tunneling between said floating gate and said drain when writing the electrical data to said memory device; and
a storage medium disposed between said control circuit and said memory device operable to cause said electron tunneling to be maintained until a state change occurs for said memory device.

19. The integrated circuit of claim 18 wherein said memory device is an electronically erasable programmable read only memory (EEPROM).

20. The integrated circuit of claim 19 wherein the electrical data is binary digital data.

21. The integrated circuit of claim 18 wherein said control circuit and said storage medium cooperate to write a binary state 0 to said memory device when in a conductive state, and to write a binary state 1 to said memory device when in a nonconductive state.

22. The integrated circuit of claim 21 wherein said control circuit and said storage medium are operable to generate and maintain electron tunneling from said floating gate to said drain when writing in said conductive state to said memory device.

23. The integrated circuit of claim 21 wherein said control circuit and said storage medium are operable to generate and maintain electron tunneling from said drain to said floating gate when writing in said nonconductive state to said memory device.

24. The integrated circuit of claim 21 wherein said control circuit and said storage medium are operable to couple said gate to ground potential and said drain to a high potential when writing to said memory device in said conductive state.

25. The integrated circuit of claim 24 wherein said high potential is about 7 volts.

26. The integrated circuit of claim 21 wherein said control circuit and said storage medium are operable to couple said floating gate to a high potential and said drain to ground potential when writing to said memory device in said nonconductive state.

27. The integrated circuit of claim 26 wherein said high potential is about 7 volts.

28. The integrated circuit of claim 18 wherein said control circuit and said storage medium cooperate to electrically couple said memory device to a voltage source to initiate and maintain said electron tunneling between said floating gate and said drain when writing the electrical data to said memory device.

29. The integrated circuit of claim 28 wherein said electron tunneling takes approximately 100 milliseconds to establish a binary 0 when said control circuit operates in said conductive state, and wherein said electron tunneling takes approximately 100 milliseconds to establish a binary 1 when said control circuit operates in said nonconductive state.

30. The integrated circuit of claim 28 wherein said control circuit is operable to decouple said memory device from said voltage source at a predetermined time after initiating said electron tunneling, said storage medium thereafter operating to substantially maintain said electron tunneling between said floating gate and said drain when writing the electrical data to said memory device.

31. The integrated circuit of claim 30 wherein said predetermined time for decoupling said memory device from said voltage source after initiating said electron tunneling is approximately 10 nanoseconds.

32. The integrated circuit of claim 18 wherein said control circuit and said storage medium collectively comprise:
   a first transistor having a gate, a source and a drain;
   a second transistor having a drain coupled to said source of said first transistor, a source coupled via a coupling means to said memory device gate, said coupling means including a first capacitor, and a gate;
   a second capacitor coupled between said second transistor source and ground;
   a third capacitor coupled between said memory device drain and ground;
   a third transistor having a gate coupled to said gate of said first transistor, a source, and a drain;
   a fourth transistor having a source coupled to said memory device drain and said third capacitor, a gate coupled to said gate of said second transistor, and a drain coupled to said source of said third transistor;
   a source signal line coupled to said memory device source of said EEPROM to supply a given electrical signal thereto;
   a gate signal line coupled to said drain of said first transistor to supply a given electrical signal thereto;
   a drain signal line coupled to said drain of said third transistor to supply a given electrical signal thereto;
   a first memory address signal line coupled to said gates of said first and said third transistors for supplying an electrical signal thereto; and
   a second memory address signal line coupled to said gates of said second and said fourth transistors to supply an electrical signal thereto.

33. A memory storage device for storing electrical data, comprising:
   at least one memory cell, said at least one memory cell comprising a memory device having a gate, a floating gate, a source and a drain, wherein said floating gate is disposed between said gate and said drain;
   a control circuit coupled to said memory device for writing the electrical data to and reading the electrical data from said memory device, said control circuit being operable to generate electron tunneling between said floating gate and said drain when writing the electrical data to said memory device; and
   a storage medium disposed between said control circuit and said memory device operable to cause said electron tunneling to be maintained until a state change occurs for said memory device.

34. The memory storage device of claim 33 wherein said memory device is an EEPROM.

35. A memory cell for storing electrical data, comprising:
   a memory device having a gate, a floating gate, a source and a drain, wherein said floating gate is disposed between said gate and said drain;
   a control circuit coupled to said memory device for writing the electrical data to and reading the electrical data from said memory device, said control circuit being operable to electrically couple said memory device to a voltage source to initiate electron tunneling between said floating gate and said drain when writing the electrical data to said memory device; and
   wherein said control circuit is operable to decouple said memory device from said voltage source at a predetermined time after initiating said electron tunneling while substantially maintaining said electron tunneling between said floating gate and said drain when writing the electrical data to said memory device.

36. An integrated circuit for storing electrical data, comprising:
   at least one memory cell, said at least one memory cell comprising a memory device having a gate, a floating gate, a source and a drain, wherein said floating gate is disposed between said gate and said drain;
   a control circuit coupled to said memory device for writing the electrical data to and reading the electrical data from said memory device, said control circuit being operable to electrically couple said memory device to a voltage source to initiate electron tunneling between said floating gate and said drain when writing the electrical data to said memory device; and
   wherein said control circuit is operable to decouple said memory device from said voltage source at a predetermined time after initiating said electron tunneling while substantially maintaining said electron tunneling between said floating gate and said drain when writing the electrical data to said memory device.

37. The integrated circuit of claim 36 wherein said memory device is an EEPROM.

38. A memory cell for storing electrical data, comprising:
   a memory device having a gate, a floating gate, a source and a drain, wherein said floating gate is disposed between said gate and said drain; and
   a control circuit coupled to said memory device for writing the electrical data to and reading the electrical data from said memory device, said control circuit being operable to generate electron tunneling between said floating gate and said drain when writing the electrical data to said memory device;
   wherein said control circuit is operable to electrically couple said memory device to a voltage source to initiate said electron tunneling between said floating gate and said drain when writing the electrical data to said memory device; and
   further wherein said control circuit is operable to decouple said memory device from said voltage source at a predetermined time after initiating said electron tunneling while substantially maintaining said electron tunneling between said floating gate and said drain when writing the electrical data to said memory device.

39. The memory cell of claim 38 wherein said predetermined time for decoupling said memory device from said voltage source after initiating said electron tunneling is approximately 10 nanoseconds.

40. A memory cell for storing electrical data, comprising:
   a memory device having a gate, a floating gate, a source and a drain, wherein said floating gate is disposed between said gate and said drain; and
   a control circuit coupled to said memory device for writing the electrical data to and reading the electrical data from said memory device, said control circuit being operable to generate electron tunneling between said floating gate and said drain when writing the electrical data to said memory device;

wherein said control circuit comprises:
- a first transistor having a gate, a source and a drain;
- a second transistor having a drain coupled to said source of said first transistor, a source coupled via a coupling means to said memory device gate, said coupling means including a first capacitor, and a gate;
- a second capacitor coupled between said second transistor source and ground;
- a third capacitor coupled between said memory device drain and ground;
- a third transistor having a gate coupled to said gate of said first transistor, a source, and a drain;
- a fourth transistor having a source coupled to said memory device drain and said third capacitor, a gate coupled to said gate of said second transistor, and a drain coupled to said source of said third transistor;
- a source signal line coupled to said memory device source to supply a given electrical signal thereto;
- a gate signal line coupled to said drain of said first transistor to supply a given electrical signal thereto;
- a drain signal line coupled to said drain of said third transistor to supply a given electrical signal thereto;
- a first memory address signal line coupled to said gates of said first and said third transistors for supplying an electrical signal thereto; and
- a second memory address signal line coupled to said gates of said second and said fourth transistors to supply an electrical signal thereto.

41. An integrated circuit for storing electrical data, comprising:

at least one memory cell, said at least one memory cell comprising a memory device having a gate, a floating gate, a source and a drain, wherein said floating gate is disposed between said gate and said drain; and a control circuit coupled to said memory device for writing the electrical data to and reading the electrical data from said memory device, said control circuit being operable to generate electron tunneling between said floating gate and said drain when writing the electrical data to said memory device;

wherein said control circuit is operable to electrically couple said memory device to a voltage source to initiate said electron tunneling between said floating gate and said drain when writing the electrical data to said memory device; and further wherein said control circuit is operable to decouple said memory device from said voltage source at a predetermined time after initiating said electron tunneling while substantially maintaining said electron tunneling between said floating gate and said drain when writing the electrical data to said memory device.

42. The integrated circuit of claim 41 wherein said predetermined time for decoupling said memory device from said voltage source after initiating said electron tunneling is approximately 10 nanoseconds.

43. An integrated circuit for storing electrical data, comprising:

at least one memory cell, said at least one memory cell comprising a memory device having a gate, a floating gate, a source and a drain, wherein said floating gate is disposed between said gate and said drain; and a control circuit coupled to said memory device for writing the electrical data to and reading the electrical data from said memory device, said control circuit being operable to generate electron tunneling between said floating gate and said drain when writing the electrical data to said memory device;

wherein said control circuit comprises:
- a first transistor having a gate, a source and a drain;
- a second transistor having a drain coupled to said source of said first transistor, a source coupled via a coupling means to said memory device gate, said coupling means including a first capacitor, and a gate;
- a second capacitor coupled between said second transistor source and ground;
- a third capacitor coupled between said memory device drain and ground;
- a third transistor having a gate coupled to said gate of said first transistor, a source, and a drain;
- a fourth transistor having a source coupled to said memory device drain and said third capacitor, a gate coupled to said gate of said second transistor, and a drain coupled to said source of said third transistor;
- a source signal line coupled to said memory device source to supply a given electrical signal thereto;
- a gate signal line coupled to said drain of said first transistor to supply a given electrical signal thereto;
- a drain signal line coupled to said drain of said third transistor to supply a given electrical signal thereto;
- a first memory address signal line coupled to said gates of said first and said third transistors for supplying an electrical signal thereto; and
- a second memory address signal line coupled to said gates of said second and said fourth transistors to supply an electrical signal thereto.

* * * * *